US011897239B2

(12) United States Patent
Liu et al.

(10) Patent No.: US 11,897,239 B2
(45) Date of Patent: Feb. 13, 2024

(54) LAMINATING DEVICE

(71) Applicants: Chengdu BOE Optoelectronics Technology Co., Ltd., Sichuan (CN); BOE Technology Group Co., Ltd., Beijing (CN)

(72) Inventors: Xingguo Liu, Beijing (CN); Wei Qing, Beijing (CN); Shaokui Liu, Beijing (CN); Zhihui Wang, Beijing (CN); Zuquan Chen, Beijing (CN); Wei Zeng, Beijing (CN); Danping Shen, Beijing (CN); Jia Deng, Beijing (CN); Jialin Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 71 days.

(21) Appl. No.: 17/425,950

(22) PCT Filed: Jan. 7, 2021

(86) PCT No.: PCT/CN2021/070668
§ 371 (c)(1),
(2) Date: Jul. 27, 2021

(87) PCT Pub. No.: WO2021/143614
PCT Pub. Date: Jul. 22, 2021

(65) Prior Publication Data
US 2022/0161536 A1    May 26, 2022

(30) Foreign Application Priority Data
Jan. 17, 2020   (CN) .......................... 202020112982.4

(51) Int. Cl.
B32B 37/00     (2006.01)
B32B 37/10     (2006.01)
(Continued)

(52) U.S. Cl.
CPC .......... B32B 37/0046 (2013.01); B32B 37/10 (2013.01); *B32B 37/003* (2013.01);
(Continued)

(58) Field of Classification Search
CPC . B32B 37/0046; B32B 37/10; B32B 38/1866; B32B 2457/206; H01L 2251/5338
See application file for complete search history.

(56) References Cited

U.S. PATENT DOCUMENTS 10,518,515 B2 * 12/2019 Choi .................. B32B 37/0046
2014/0345792 A1   11/2014 Lee et al.
(Continued)

FOREIGN PATENT DOCUMENTS

CN    108198515 A    6/2018
CN    108648630 A    10/2018
(Continued)

OTHER PUBLICATIONS

International Search Report for PCT/CN2021/070668 dated Apr. 12, 2021.

*Primary Examiner* — Carson Gross
(74) *Attorney, Agent, or Firm* — Ling Wu; Stephen Yang; Ling and Yang Intellectual Property

(57) ABSTRACT

A lamination device includes: an elastic lamination seat, including a deformation bearing portion, the deformation bearing portion including a bearing surface for bearing a to-be-laminated flexible display panel, and the bearing surface being configured as a curved surface protruding towards the cover plate; an auxiliary bearing film, configured to pre-bend and fix the to-be-laminated flexible display (Continued)

panel onto the bearing surface when the elastic lamination seat is in a natural state; and a driving mechanism, connected to the elastic lamination seat and configured to drive the elastic lamination seat to move towards or away from the cover plate, wherein when the driving mechanism drives the elastic lamination seat to move towards the cover plate, the elastic lamination seat is squeezed to produce elastic deformation and the bearing surface gradually laminates the flexible display panel onto the cover plate from the middle to two sides.

17 Claims, 5 Drawing Sheets

(51) Int. Cl.
*G09F 9/30* (2006.01)
*B32B 38/18* (2006.01)

(52) U.S. Cl.
CPC ....... *B32B 38/1866* (2013.01); *B32B 2383/00* (2013.01); *B32B 2457/206* (2013.01); *G09F 9/301* (2013.01)

(56) References Cited

U.S. PATENT DOCUMENTS

| | | |
|---|---|---|
| 2016/0202728 A1 | 7/2016 | Kim |
| 2018/0134022 A1* | 5/2018 | Kim .................. B32B 38/18 |
| 2019/0329540 A1* | 10/2019 | Kim .................. B32B 38/0012 |
| 2020/0047475 A1 | 2/2020 | Gao et al. |

FOREIGN PATENT DOCUMENTS

| | | | |
|---|---|---|---|
| CN | 209794814 U | 12/2019 | |
| CN | 210837808 U | 6/2020 | |
| KR | 10-20200008932 | * 1/2020 | ........... B29C 39/026 |

* cited by examiner

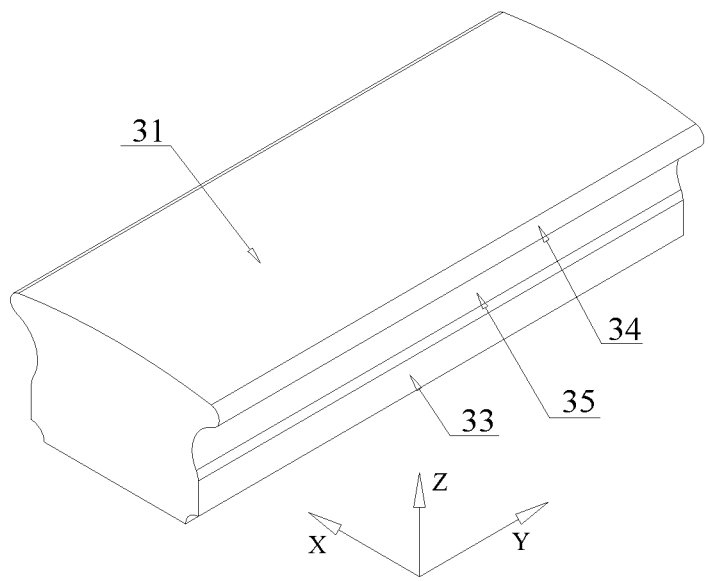
FIG. 7
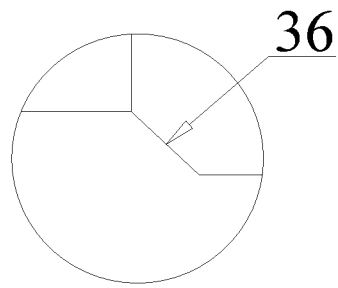 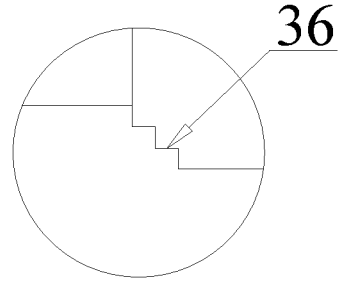
FIG. 8                FIG. 9

LAMINATING DEVICE

CROSS-REFERENCE TO RELATED APPLICATIONS

The present application is a U.S. National Phase Entry of International Application No. PCT/CN2021/070668 having an international filing date of Jan. 7, 2021, which claims the priority of Chinese patent application No. 202020112982.4 filed to CNIPA on Jan. 17, 2020, entitled "Lamination Device". The entire contents of the above-identified applications are hereby incorporated by reference.

TECHNICAL FIELD

Embodiments of the present disclosure relate to, but are not limited to, the technical field of a display device, and particularly relate to a lamination device.

BACKGROUND

Currently, an Organic Light-Emitting Diode (OLED) flexible display panel as a display part of an electronic device has been widely applied in various electronic products, and with the development of a curved screen, a glass cover plate outside an OLED module not only includes a flat region, but also includes cambered regions located at two sides of the flat region, and angles of the cambered regions are larger and larger, resulting in that higher requirements are made to full lamination of the glass cover plate and the OLED flexible display panel.

However, a lamination device can only meet the requirement for lamination of the small-angle glass cover plate and the flexible display panel.

SUMMARY

The following is an overview of the subject matter described in detail herein. The overview is not intended to limit the protection scope of the claims.

An embodiment of the present disclosure provides a lamination device configured to laminate a cover plate onto a flexible display panel and including:

an elastic lamination seat, including a deformation bearing portion, the deformation bearing portion including a bearing surface for bearing a to-be-laminated flexible display panel, and the bearing surface being configured as a curved surface protruding towards the cover plate;

an auxiliary bearing film, configured to pre-bend and fix the to-be-laminated flexible display panel on the bearing surface when the elastic lamination seat is in a natural state; and, a driving mechanism, connected to the elastic lamination seat and configured to drive the elastic lamination seat to move towards or away from the cover plate, wherein when the driving mechanism drives the elastic lamination seat to move towards the cover plate, the elastic lamination seat is squeezed to produce elastic deformation and the bearing surface gradually laminates the flexible display panel onto the cover plate from the middle to two sides.

After the drawings and the detailed description are read and understood, other aspects of the present disclosure can be understood.

BRIEF DESCRIPTION OF DRAWINGS

The drawings are provided for facilitating understanding the technical solution of the present disclosure, constitute one portion of the specification, and are used for illustrating the technical solution of the present disclosure together with embodiments of the present disclosure, but are not intended to limit the technical solution of the present disclosure.

FIG. 7 is a structural schematic diagram of an elastic lamination seat;

FIG. 8 is a structural schematic diagram of a transitional surface in an exemplary embodiment;

FIG. 9 is a structural schematic diagram of a transitional surface in an exemplary embodiment;

DETAILED DESCRIPTION

The embodiments of the present disclosure will be illustrated in detail below in connection with the drawings. In case of no conflict, the embodiments of the present disclosure and the characteristics in the embodiments can be randomly combined with each other.

When a glass cover plate and an OLED flexible display panel are laminated, lamination of a small-angle glass cover plate and the OLED flexible display panel can be realized by adopting a vacuum lamination device. There may be some lamination equipment suitable for large-angle lamination, but the large-angle lamination device is poor in reliability, stability and tolerance, the lamination yield is difficult to rapidly improve in short time, and in addition, the lamination device is relatively high in cost. For example, in order to implement lamination of a large-angle glass cover plate and the OLED flexible display panel, a lamination device including a sliding block mechanism can be adopted. However, the lamination device including the sliding block mechanism is poor in reliability, stability and tolerance, the lamination yield is difficult to rapidly improve, and in addition, the lamination device is relatively high in cost.

An embodiment of the present disclosure provides a lamination device, configured to laminate a cover plate onto a flexible display panel. The lamination device includes:

an elastic lamination seat, including a deformation bearing portion, the deformation bearing portion including a bearing surface for bearing a to-be-laminated flexible display panel, and the bearing surface being configured as a curved surface protruding towards the cover plate;

an auxiliary bearing film, configured to pre-bend and fix the to-be-laminated flexible display panel on the bearing surface when the elastic lamination seat is in a natural state; and a driving mechanism, connected to the elastic lamination seat and configured to drive the elastic lamination seat to move towards or away from the cover plate, when the driving mechanism drives the elastic lamination seat to move towards the cover plate, the elastic lamination seat being squeezed to produce elastic deformation and the bearing surface gradually laminating the flexible display panel onto the cover plate from the middle to two sides.

The technical solutions of the embodiments of the present disclosure will be illustrated in detail below by the embodiments.

Figure 1:
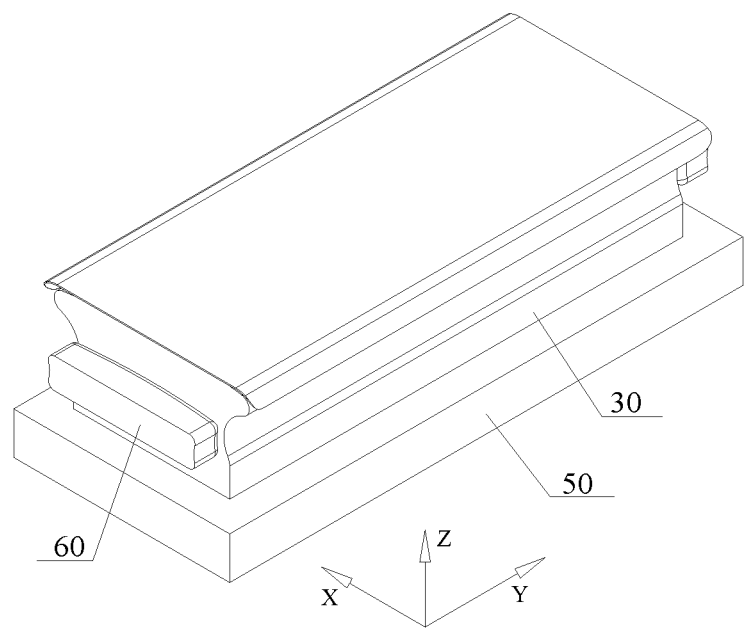
FIG. 1 is a structural schematic diagram of a lamination device according to an embodiment of the present disclosure.
Figure 2:
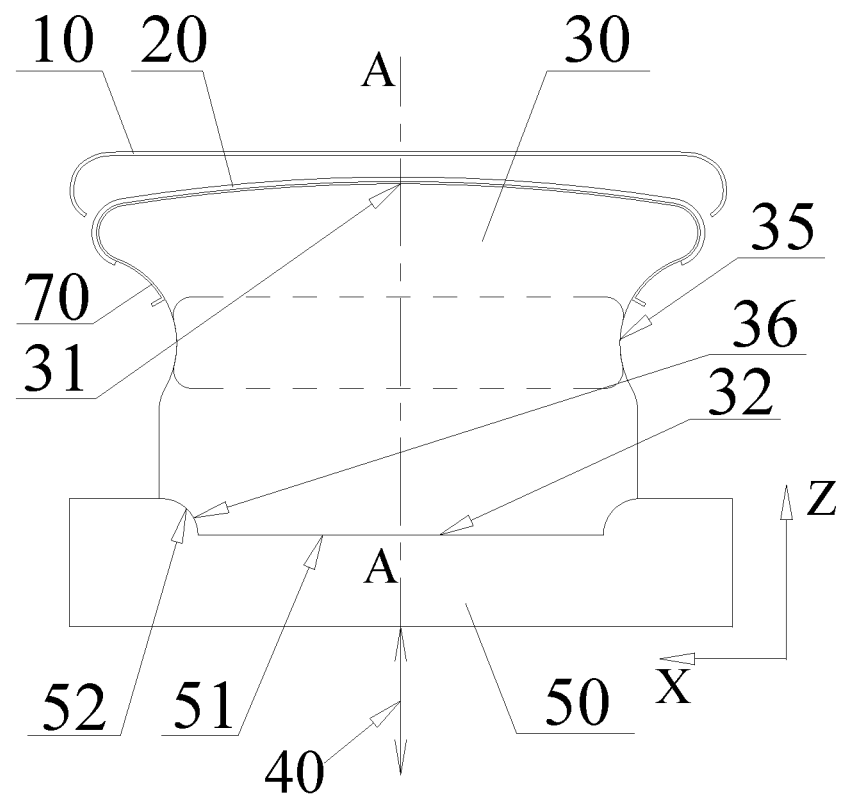
FIG. 2 is a schematic diagram of sectional structure of the lamination device before lamination.
Figure 3:
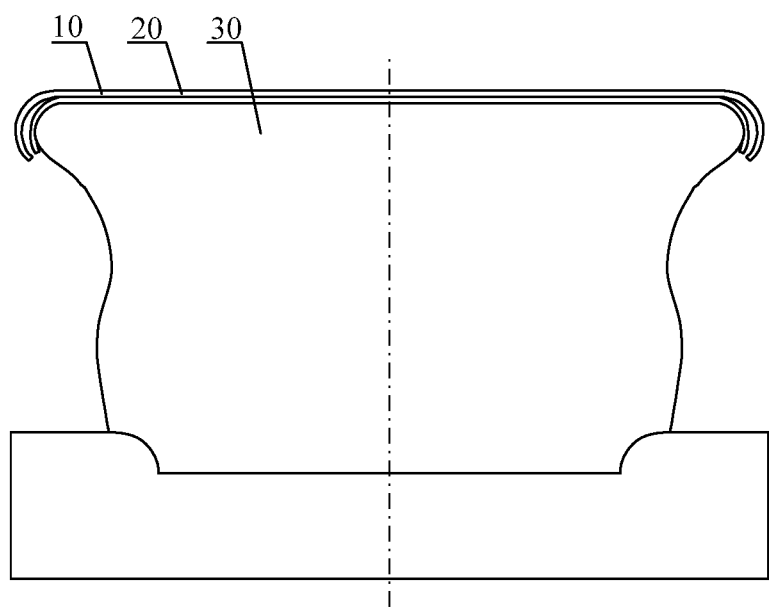
FIG. 3 is a schematic diagram of sectional structure of the lamination device in the laminating process.
Figure 4:
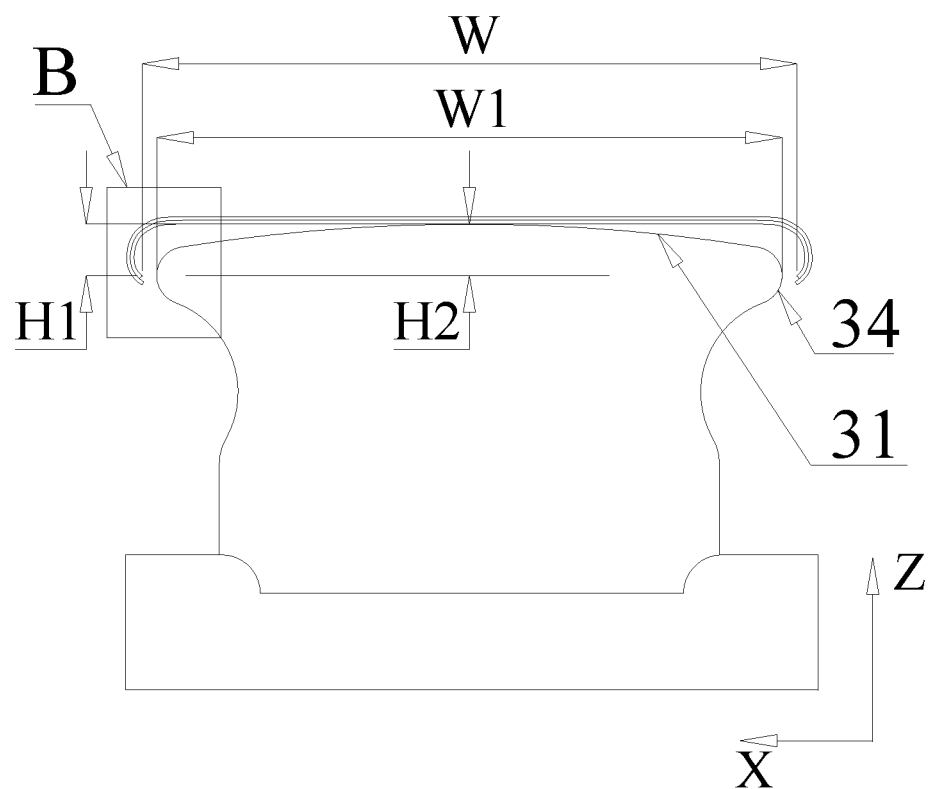
FIG. 4 is a schematic diagram of sectional structure of the lamination device after lamination is finished.
Figure 5:
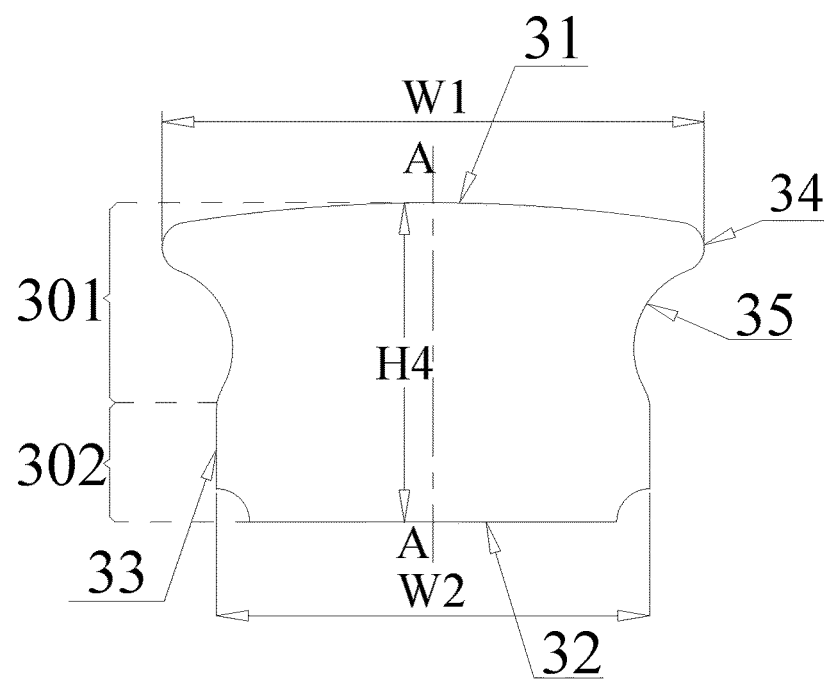
FIG. 5 is a schematic diagram of sectional structure of an elastic lamination seat.

FIG. 1 is a structural schematic diagram of a lamination device according to an embodiment of the present disclosure, FIG. 2 is a schematic diagram of sectional structure of the lamination device before lamination, FIG. 3 is a schematic diagram of sectional structure of the lamination device in the laminating process, FIG. 4 is a schematic diagram of sectional structure of the lamination device after lamination is finished, and FIG. 5 is a schematic diagram of sectional structure of an elastic lamination seat. In FIG. 4, the elastic lamination seat has been recovered into the natural state. As shown in FIG. 1 to FIG. 5, an embodiment of the present disclosure provides a lamination device. The lamination device is configured to laminate a cover plate 10 onto a flexible display panel 20. The lamination device includes an elastic lamination seat 30, the elastic lamination seat 30 includes a deformation bearing portion 301, the deformation bearing portion 301 includes a bearing surface for bearing a to-be-laminated flexible display panel 20, and the bearing surface is configured as a curved surface protruding towards the cover plate 10. The lamination device further includes an auxiliary bearing film 70, the auxiliary bearing film 70 is configured to pre-bend the to-be-laminated flexible display panel and fix the flexible display panel on the bearing surface when the elastic lamination seat is in a natural state, as shown in FIG. 2. The lamination device further includes a driving mechanism 40 (The figure shows the movement direction of the driving mechanism), and the driving mechanism 40 is connected to the elastic lamination seat. The driving mechanism 40 is configured to drive the elastic lamination seat 30 to move towards or away from the cover plate 10. When the driving mechanism 40 drives the elastic lamination seat 30 to move towards the cover plate 10, the elastic lamination seat 30 is squeezed to produce elastic deformation, and the bearing surface gradually laminates the flexible display panel 20 onto the cover plate 10 from the middle to two sides, so that the flexible display panel 20 is gradually laminated with the cover plate 10 from the middle to two sides. It is easy to understand that the auxiliary bearing film can be deformed along with the shape of the flexible display panel, in order to facilitate illustration, the auxiliary bearing film is shown in FIG. 2, but not shown in FIG. 3 and FIG. 4.

According to the lamination device provided by the embodiment of the present disclosure, the bearing surface of the elastic lamination seat 30 is configured as the curved surface protruding towards the cover plate 10. When the driving mechanism drives the bearing surface which bears the to-be-laminated flexible display panel 20 to gradually approach to the cover plate 10, the bearing surface is an out-protruding curved surface , and thus, the flexible display panel 20 is laminated with the cover plate 10 first at a highest point position of the bearing surface (the highest point position is a position, closest to the cover plate 10, on the bearing surface before the bearing surface is elastically deformed). As the driving mechanism 40 drives the elastic lamination seat 30 to continue to move towards the cover plate, the elastic lamination seat 30 is squeezed to generate elastic deformation, and the bearing surface gradually laminates the flexible display panel onto the cover plate 10 from the middle to two sides, so that the flexible display panel 20 is gradually laminated with the cover plate 10 from the middle to two sides. In such manner of gradually laminating from the middle to two sides, bubble generated at four corners of the display panel can be avoided, and the yield of a lamination product is improved.

In addition, the elastic lamination seat 30 is made of an elastic material, and when the elastic lamination seat 30 generates elastic deformation under the action of the driving mechanism 40 and the cover plate 10, a squeezing force applied to the elastic lamination seat 30 can be transferred along with deformation of the elastic lamination seat 30, so that stress centralization in a lamination region can be prevented, and a failure of the OLED display panel, which is caused by stress centralization, is avoided.

According to the lamination device provided by the embodiment of the present disclosure, the flexible display panel and the cover plate are laminated through elastic deformation of the elastic lamination seat 30, and in the elastic deforming process of the elastic lamination seat 30, due to limitation of the cover plate 10, deformation of the bearing surface of the elastic lamination seat 30 matches with the shape of the cover plate 10, so that the flexible display panel can be perfectly laminated with the cover plate without limitation of a cambered angle of the cover plate 10, and thus, the lamination device can be applicable to a large-angle cambered cover plate, and can be applicable to a cover plate of which the cambered angle is 90° to 150°.

In an exemplary embodiment, the lamination device further can include a fixing apparatus, and the fixing apparatus is configured to fix the auxiliary bearing film on the bearing surface of the elastic lamination seat.

In an exemplary embodiment, as shown in FIG. 2, the shape of the cover plate 10 may be of a symmetrical shape. The cross-sectional shape of the elastic lamination seat 30 is a symmetrical shape about a symmetry axis of the cover plate 10. By such structure, the bearing surface also can be symmetrical with respect to the symmetry axis of the cover plate 10. For example, in FIG. 2, the symmetry axis of the cover plate 10 is AA, then the cross-sectional shape of the elastic lamination seat 30 is also symmetrical with respect to the axis AA, and the bearing surface also can be symmetrical with respect to the axis AA. Therefore, in the laminating process, a position (i.e., the highest point position of the bearing surface), located on the symmetry axis AA, of the flexible display panel 20 is in contact and laminates with the cover plate 10 first, and under the acting force of the driving mechanism 40, the elastic lamination seat 30 can generate symmetrical deformation at two sides of the symmetry axis AA, so that the flexible display panel 20 is gradually laminated onto the cover plate 10 from the symmetry axis AA to two sides.

In an exemplary embodiment, as shown in FIG. 2, the driving mechanism 40 can drive the elastic lamination seat 30 to move along a direction of a symmetry axis of the elastic lamination seat 30. Therefore, it is ensured that the elastic lamination seat 30 can generate symmetrical deformation, thus it is ensured that a lamination speed of the flexible display panel 20 from the middle to two sides is kept consistent, and the laminating effect is improved.

In an exemplary embodiment, the material of the elastic lamination seat 30 can include a rubber material, e.g., silicone. Hardness of the elastic lamination seat 30 may be 20A to 40A.

In the embodiments of the present disclosure, a direction parallel to the symmetry axis AA of the cross section of the elastic lamination seat 30 can be defined as a third direction Z, a direction perpendicular to the third direction Z is defined as a first direction X, and a direction parallel to an extension direction of the elastic lamination seat 30 is defined as a second direction Y.

FIG. 5 is the sectional structural schematic diagram of the elastic lamination seat. As shown in FIG. 5, the bearing surface includes second cambered surfaces 34 at two ends and a first cambered surface 31 located between the two second cambered surfaces 34. The second cambered surfaces 34 are tangentially connected to the first cambered surface 31. As shown in FIG. 2 and FIG. 5, the first cambered surface 31 is symmetrical about the axis AA, the second cambered surfaces 34 located at two ends of the first cambered surface 31 are also symmetrical about the axis AA.

As shown in FIG. 4, the flexible display panel 20 after being laminated onto the cover plate 10 has curved sections at two ends and a flat section between the two curved sections in the first direction X. In the direction X, a length of the first cambered surface 31 is equal to a length of the flat section of the flexible display panel. Therefore, in the deforming process of the elastic lamination seat 30, the first cambered surface 31 generates deformation to enable the flat section to be laminated with the cover plate, and the second cambered surfaces 34 generate deformation to fill up the curved sections of the flexible display panel 20, so that it can be ensured that the curved sections are well filled by the elastic lamination seat 30, and the laminating effect is improved.

In an exemplary embodiment, a length of the second cambered surface 34 may be greater than or equal to a length of the curved section of the flexible display panel, and the length of the cambered surface 34 can be understood as a length of a curved shape, so that in the laminating process, the curved section can be fully filled by the second cambered surface, thereby ensuring that the curved section can be fully laminated with the cover plate.

In an exemplary embodiment, the deformation bearing portion further includes a third cambered surface 35, as shown in FIG. 5, the third cambered surface 35 is tangentially connected with an end, away from the first cambered surface 31, of the second cambered surface 34, the second cambered surface 34 is an out-protruding cambered surface, and the third cambered surface 35 is recessed towards the elastic lamination seat. By such structure, when the driving mechanism 40 applies an acting force to the elastic lamination seat 30, deformation of the third cambered surface 35 can apply an acting force to the second cambered surface 34 along a tangential direction of a junction of the third cambered surface 35 and the second cambered surface 34 so as to promote the second cambered surface 34 to be filled to the curved section of the flexible display panel 20 and laminate the curved section with a cambered section of the cover plate.

When the driving mechanism 40 drives the elastic lamination seat 30 to move towards the cover plate to carry out the laminating, the elastic lamination seat with the structure as shown in FIG. 5 can ensure that in the process that the elastic lamination seat 30 is squeezed, the acting force applied by the driving mechanism 40 is gradually dispersed from the middle to two sides of the elastic lamination seat 30, so that the first cambered surface 31 is gradually close to the cover plate from the middle to two sides, and it can be realized that the flexible display panel 20 is gradually laminated with the cover plate 10 from the middle to the side edge.

In an exemplary embodiment, as shown in FIG. 4, after the flexible display panel 20 is laminated with the cover plate 20, a width in a first direction X between two ends on a side, facing the elastic lamination seat 30, of the flexible display panel 20 is W. A width of the deformation bearing portion 301 of the elastic lamination seat 30 in the first direction X is W1, and W1 is less than W. Therefore, after the flexible display panel 20 is laminated with the cover plate 10, the elastic lamination seat 30 can recover its shape and detached so as to avoid a case that the elastic lamination seat 30 cannot be detached due to interference generated between the elastic lamination seat 30 and the laminated flexible display panel 20, and ensure repeated use of the lamination device. As shown in FIG. 5, the width W1 of the deformation portion 301 in the first direction X is the distance between two second cambered surfaces 34 in the first direction X.

Figure 6:
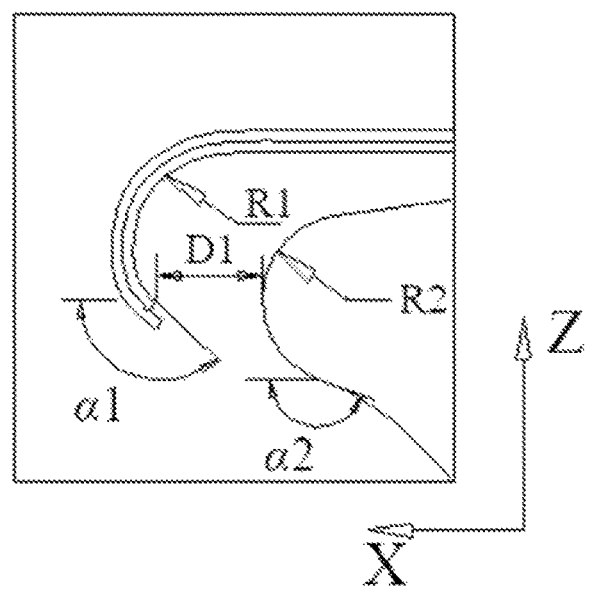
FIG. 6 is an enlarged schematic diagram of portion B in FIG. 4.

FIG. 6 is an enlarged schematic diagram of portion B in FIG. 4. In an exemplary embodiment, a single side difference value D1 of W and W1 may be 1 mm to 2 mm, and in other words, at the left side or the right side, the difference value D1 of W and W1 may be 1 mm to 2 mm. In implementation, D1 may be 1 mm, 1.2 mm, 1.5 mm, 1.8 mm or 2 mm. By setting D1 in this way, in-advance contact between the pre-bent flexible display panel and the edge of the cover plate in the laminating process can be prevented, and generation of lamination cracks is avoided. When the single side difference value of W and W1 is too large, it may be caused that the deformed elastic lamination seat 30 cannot be matched with the cover plate 10 in shape, resulting in that the flexible display panel 20 and the cover plate are incompletely laminated. When the single side difference value D1 of W and W1 is too small, the pre-bent flexible display panel and the edge of the cover plate may be in contact in advance in the laminating process, resulting in generation of the lamination cracks.

In an exemplary embodiment, as shown in FIG. 5, the elastic lamination seat further includes a deformation supporting portion 302, and the deformation supporting portion 302 includes a supporting surface 32 opposite to the bearing surface and flat side surfaces 33 located at two ends of the supporting surface 32. The flat side surfaces 33 connect the third cambered surface 35 with the supporting surface 32. The flat side surfaces 33 are in smoothly transitional connection with the third cambered surface 35.

In an exemplary embodiment, as shown in FIG. 5, a width of the deformation supporting portion 302 in the first direction X may be W2, W2 is less than W1, and a difference value of W1 and W2 may be 5 mm to 10 mm. In the implementation, the difference value of W1 and W2 may be 5 mm, 6 mm, 7 mm, 8 mm, 9 mm or 10 mm. By setting the difference value of W1 and W2 to be within a range of 5 mm to 10 mm, the lamination sequence of the elastic lamination seat and the cover plate can be well controlled so as to ensure the lamination effect. In addition, in the deforming process of the elastic lamination seat, it can be ensured that interference cannot be generated between the elastic lamination seat and the fixing apparatus of the auxiliary bearing film.

In an exemplary embodiment, as shown in FIG. 4, a maximum distance between a circle center of the second cambered surface 34 and the first cambered surface 31 in a third direction Z may be H2. A distance between an end of the curved section away from the flat section and the flat section in the third direction Z is H1. H2 is less than or equal to H1. In such setting manner, it can be avoided that the elastic lamination seat is in contact in advance with a cambered region of the cover plate, and it can be ensured that the bearing surface can be gradually laminated with the cover plate from the middle to two sides.

As shown in FIG. 6, a radius R2 of the second cambered surface 34 may be less than or equal to a minimum radius R1 of the curved section of the flexible display panel 20. When R2 is greater than R1, after the elastic lamination seat 30 is deformed to enable the flexible display panel 20 to be laminated with the cover plate, the second cambered surface 34 of the elastic lamination seat 30 can generate a large deforming force, and thus it is liable to damage the cover plate and thus damage the flexible display panel 20. R2 is set to be less than or equal to the minimum radius R1 of the curved section of the flexible display panel 20, so that in the process of laminating the flexible display panel 20 with the cover plate 10 and in the process that the elastic lamination seat 30 can recover its shape and detached, the second cambered surface 34 cannot damage the flexible display panel 20. In an exemplary embodiment, as shown in FIG. 6, an angle between a tangent at the junction of the second cambered surface 34 and the third cambered surface 35 and the first direction X is $\alpha 2$, an angle between a tangent at an endpoint of one end, away from the flat section, of the curved section of the flexible display panel and the first direction X is $\alpha 1$, and $\alpha 2 \geq \alpha 1$. Therefore, in the deforming process of the elastic lamination seat 30, a deformation amount of the third cambered surface 35 cannot go beyond one end, away from the flat section, of the curved section of the flexible display panel, so that damage of the deformed third cambered surface 35 to the flexible display panel can be avoided.

FIG. 7 is a structural schematic diagram of the elastic lamination seat. In an exemplary embodiment, as shown in FIG. 7, in the second direction Y, a radius of the third cambered surface 35 is kept unchanged. It is easy to understand that the radius of the third cambered surface 35 may be a radius corresponding to a cross-sectional arc length of the third cambered surface 35, and as shown in FIG. 5, may be a radius corresponding to the arc length of the third cambered surface 35. In the implementation, the curved radius of the third cambered surface 35 can be reasonably designed by simulation or experiments so as to avoid interference between the elastic lamination seat and the fixing apparatus of the auxiliary bearing film in the deforming process.

In an exemplary embodiment, in the second direction Y, from the middle to two ends of the elastic lamination seat, the radius of the third cambered surface 35 is gradually increased. When the elastic lamination seat 30 is acted on by the driving mechanism 40, the elastic lamination seat 30 is squeezed to generate deformation towards the first direction X, the second direction Y and the third direction Z. The second direction Y is described as a front-and-rear direction, the first direction X is described as a left-and-right direction, and then in the second direction Y, i.e., the front-and-rear direction, a middle portion of the elastic lamination seat can be inhibited by an adjacent material in the process that the middle portion is deformed towards both front and rear ends, and thus, a deformation amount of the middle portion of the elastic lamination seat towards both left and right ends is relatively large. In the second direction Y, both the front and rear ends of the elastic lamination seat are inhibited a little by the adjacent material, and deformation amounts of the front end and the rear end of the elastic lamination seat towards both the left and right ends are small, and the deformation amounts of the front end and the rear end of the elastic lamination seat towards both the left and right ends are less than the deformation amount of the middle portion of the elastic lamination seat towards both the left and right ends. In the second direction Y, from the middle to two ends of the elastic lamination seat, the radius of the third cambered surface 35 is set to be gradually increased, so that differences between deformation amounts of the front end and the rear end of the elastic lamination seat towards two ends in the first direction X and a deformation amount of the middle portion of the elastic lamination seat towards two ends in the first direction X can be reduced, and in the second direction Y, a deformation amount of each position on the elastic lamination seat towards two ends in the first direction X can be tended to be consistent, thereby avoiding bubbles occurred at four corners in the process of laminating the flexible display panel with the cover plate.

In an exemplary embodiment, as shown in FIG. 1 and FIG. 2, the lamination device further includes a base 50, and the base 50 is arranged between the supporting surface 32 of the elastic lamination seat 30 and the driving mechanism 40. The driving mechanism 40 drives the elastic lamination seat 30 to move through the base 50. By such structure, in the process that the elastic lamination seat 30 is squeezed, the acting force applied by the driving mechanism 40 can be transferred onto the supporting surface 32 of the elastic lamination seat 30 through the base 50 so as to ensure stress uniformity of the supporting surface 32, thus ensure deformation uniformity of the deformation bearing portion 301 and improve the laminating effect.

In an exemplary embodiment, as shown in FIG. 1 and FIG. 2, a side of the base 50 facing the elastic lamination seat 30 is provided with a groove 51 matching the deformation supporting portion 302, and the supporting surface 32 of the elastic lamination seat 30 is embedded in the groove 51. Lamination of the flexible display panel 20 and the cover plate 10 is carried out in the first direction X, and by forming the groove 51 and embedding the supporting surface 32 in the groove 51, deformation of the deformation supporting portion 302 in the second direction Y can be limited in the process that the elastic lamination seat is squeezed, so that the acting force applied by the driving mechanism is transferred onto the deformation bearing portion to a greater extent.

In an exemplary embodiment, as shown in FIG. 2, the supporting surface 32 of the elastic lamination seat 30 and the flat side surface 33 are connected by a transitional surface 36. The groove 51 has a side wall 52 matching with the transitional surface 36. The transitional surface 36 is configured as a cambered surface recessed towards the elastic lamination seat 30. By adopting the transitional surface 36 and the side wall 52 which are of such structures, in the process that the elastic lamination seat is squeezed, when the driving mechanism 40 applies an acting force to the base 50 in the third direction Z, the side wall 52 applies acting forces towards the third direction Z and the first direction X to the elastic lamination seat 30 by the transitional surface 36 so as to benefit squeezing deformation of the deformation bearing portion and improve the lamination efficiency.

FIG. 8 is a structural schematic diagram of a transitional surface in an exemplary embodiment. In an exemplary embodiment, as shown in FIG. 8, the transitional surface 36 may be configured as an inclined surface.

FIG. 9 is a structural schematic diagram of a transitional surface in an exemplary embodiment. In an exemplary embodiment, as shown in FIG. 9, the transitional surface 36 may be configured as a stepped surface.

By setting the transitional surface 36 to be of a structure as shown in FIG. 2, FIG. 8 or FIG. 9, the rigidity of an edge of the elastic lamination seat 30 can be improved, outward deformation of the third cambered surface 35 is impeded to a certain degree, and the deformation sequence of the elastic lamination seat 30 from the middle to two sides can be controlled, so that the bearing surface can gradually laminate the flexible display panel onto the cover plate from the middle to two sides, bubbles between the flexible display panel and the cover plate are expelled from the middle to two sides, and generation of the bubbles at four corners after lamination is avoided. In the same displacement of the driving mechanism, the smaller a height of the elastic lamination seat in the third direction Z is, the higher the rigidity of the edge of the elastic lamination seat 30 is.

In an exemplary embodiment, as shown in FIG. 5, the height of the elastic lamination seat 30 in the third direction Z is H4, and H4 may range from 30 mm to 40 mm. In other words, a maximum distance between the supporting surface 32 and the bearing surface may be 30 mm to 40 mm. Such a height can ensure that the rigidity of the edge of the elastic lamination seat is within a proper range, which can not only avoid the deformation difficulty of the elastic lamination seat caused by the excessively high rigidity, but also avoid irregular deformation of the elastic lamination seat in the squeezing process, thus ensuring that the bearing surface gradually applies a pressure to the flexible display panel from the middle to two sides.

In an exemplary embodiment, as shown in FIG. 2, the supporting surface 32 and the bottom surface of the groove 51 can be connected by glue bonding.

Figure 10:
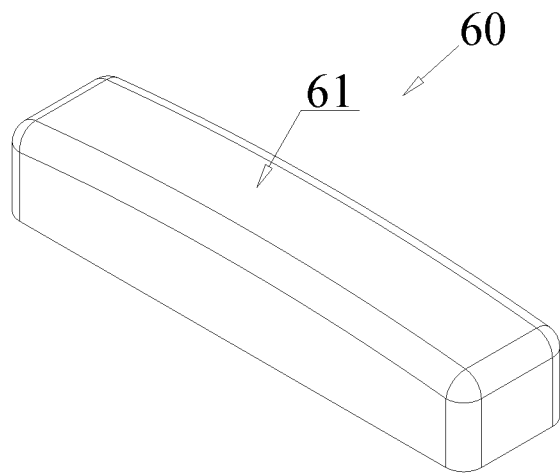
FIG. 10 is a structural schematic diagram of a stop block in FIG. 1.

FIG. 10 is a structural schematic diagram of a stop block in FIG. 1. In an exemplary embodiment, as shown in FIG. 1 and FIG. 10, the lamination device further includes stop blocks 60, and the stop blocks are arranged at two sides of the elastic lamination seat 30 in the second direction Y. The stop block 60 has a barrier wall 61 facing the elastic lamination seat 30. The stop block 60 is movable, the stop block 60 can move along the second direction Y, and can move along the third direction Z. Before the driving mechanism 40 drives the elastic lamination seat 30 to move towards the cover plate 10, the stop block 60 moves to a proper position, i.e., in the third direction Z, the stop block 60 moves to a position corresponding to a position of the third cambered surface 35, and as shown in FIG. 2, the position of the stop block 60 is indicated with dotted lines in FIG. 2. The barrier wall 61 of the stop block 60 is in contact with the side wall of the elastic lamination seat 30. Therefore, in the process that the elastic lamination seat is squeezed, the stop block 60 can prevent deformation of the elastic lamination seat 30 in the second direction Y and promote deformation of the elastic lamination seat 30 in the first direction X and the third direction Z so as to implement the lamination efficiency.

Figure 11:
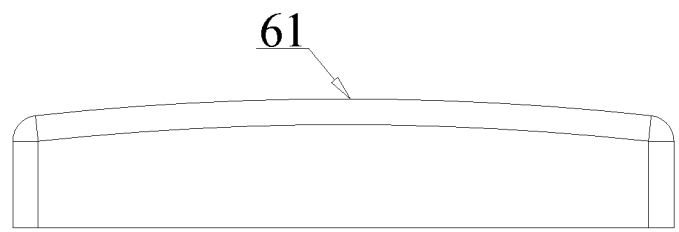
FIG. 11 is a structural schematic diagram of the stop block in FIG. 1 in Section XY.

FIG. 11 is a structural schematic diagram of the stop block in FIG. 1 in Section XY. As shown in FIG. 1 and FIG. 11, the barrier wall 61 may be symmetrical and have a cambered surface protruding in the first direction X. Therefore, after the barrier wall 61 is in contact with the side wall of the elastic lamination seat 30, in the first direction X, a contact resistance of the barrier wall 61 to the elastic lamination seat 30 is gradually decreased from the middle position to two sides of the first direction X, so that a deformation resistance of the barrier wall 61 to the elastic lamination seat 30 in the first direction X can be reduced, and the lamination efficiency is improved.

In an exemplary embodiment, a length of the elastic lamination seat 30 in the second direction Y may be less than or equal to that of the flexible display panel in the second direction Y. Therefore, it can be avoided that in the deforming process of the elastic lamination seat 30, two ends of the elastic lamination seat in the second direction Y damage the flexible display panel due to deformation.

The driving mechanism can adopt a transmission mechanism in which a motor and a ball screw cooperate, or adopt a transmission mechanism in which a motor and a screw nut cooperate, and the like.

The laminating process of the flexible display panel and the cover plate will be illustrated below in connection with FIG. 2 to FIG. 4:

the flexible display panel 20 is pre-bent and fixed on the bearing surface of the elastic lamination seat 30 by adopting the auxiliary bearing film (CF) 70, and the stop block 60 is moved to a proper position, so that the barrier wall 61 of the stop block 60 is respectively in contact with the side walls of two sides of the elastic lamination seat 30 in the second direction Y;

the driving mechanism 40 drives the elastic lamination seat 30 to move towards the cover plate 10 through the base 50, i.e., the elastic lamination seat 30 moves upwards under the action of the driving mechanism 40, until the highest point position of the flexible display panel is in contact with the cover plate 10, as shown in FIG. 2;

the driving mechanism 40 continues to drive the elastic lamination seat 30 to move upwards, the elastic lamination seat 30 is squeezed to generate deformation under the action of the base 50 and the cover plate 10, and the first cambered surface 31 of the elastic lamination seat 30 is gradually deformed from the middle position to two sides, so that the flat section of the flexible display panel is gradually laminated with the cover plate from the middle to two sides, as shown in FIG. 3; the driving mechanism 40 continues to apply an acting force upwards, until the second cambered surface 34 of the elastic lamination seat fills the curved section of the flexible display panel, so that the curved section of the flexible display panel is laminated with the cover plate; and after lamination of the flexible display panel and the cover plate is completed, the driving mechanism 40 drives the elastic lamination seat 30 to move downwards, the elastic lamination seat 30 recovers its shape, and then the auxiliary bearing film is removed so as to complete lamination of the flexible display panel and the cover plate, as shown in FIG. 4.

The lamination device provided by the embodiments of the present disclosure solves the process problems of lamination of the large-angle cover plate and the OLED flexible display panel, has high reliability, high stability and high tolerance, and greatly reduces the problems of failure and bubbles at four corners in the laminating process of the OLED flexible display panel.

The lamination device provided by the embodiments of the present disclosure is simple in structure and low in cost, parts in the lamination device can be very easily replaced, and mass production of large-angle products can be rapidly realized.

In the description of the embodiments of the present disclosure, directional or positional relationships described by terms such as "upper", "lower", "top", "bottom", "inner", "outer" and the like are directional or positional relationships shown as in the drawings, which are used for convenience in describing the embodiments of the present disclosure and simplifying the description, rather than indicating or implying that the device or component referred to must have a specific orientation, is constructed or operated in the specific orientation, and thus should not be understood as limitation to the embodiments of the present disclosure.

In the description of the embodiments of the present disclosure, unless expressly stipulated or defined, the term "connected" should be broadly understood, for example, it may be mechanically connected, or may be electrically connected, or may be directly connected, or may be indirectly connected by a medium, or may be internally communicated between two components. Those skilled in the art can understand the meanings of the terms in the present disclosure according to specific conditions.

The embodiments disclosed by the present disclosure are described as above, but the contents are merely embodiments adopted for facilitating understanding the present disclosure and are not intended to limit the present disclosure. Those skilled in the art, without departure from the spirit and scope disclosed by the present disclosure, can make any modifications and changes to the implementation form and details, but the scope of patent protection of the present disclosure still should be determined according to the scope defined by the appended claims.

What is claimed is:

1. A lamination device, configured to laminate a cover plate onto a flexible display panel, comprising:
   an elastic lamination seat, comprising a deformation bearing portion, the deformation bearing portion comprising a bearing surface for bearing a to-be-laminated flexible display panel, and the bearing surface being configured as a curved surface protruding toward the cover plate;
   an auxiliary bearing film configured to pre-bend and fix the to-be-laminated flexible display panel on the bearing surface when the elastic lamination seat is in a natural state; and,
   a driving mechanism connected to the elastic lamination seat and configured to drive the elastic lamination seat to move toward or away from the cover plate, wherein when the driving mechanism drives the elastic lamination seat to move toward the cover plate, the elastic lamination seat is squeezed to produce elastic deformation and the bearing surface gradually laminates the flexible display panel onto the cover plate from a middle to two sides; wherein
   the bearing surface comprises second cambered surfaces at two ends, a first cambered surface between the two second cambered surfaces, and a third cambered surface;
   the third cambered surface is tangentially connected with ends of the second cambered surfaces away from the first cambered surface, the third cambered surface is recessed toward the elastic lamination seat; the flexible display panel after being laminated onto the cover plate comprises curved sections at two ends and a flat section between the two curved sections;
   when the driving mechanism applies an acting force to the elastic lamination seat, deformation of the third cambered surface applies an acting force to the second cambered surface along a tangential direction of a junction of the third cambered surface and the second cambered surface so as to promote the second cambered surface to be filled to the curved section of the flexible display panel and laminate the curved section with a cambered section of the cover plate;
   wherein the elastic lamination seat further comprises a deformation supporting portion, the deformation supporting portion comprises a supporting surface opposite to the bearing surface and flat side surfaces located at two ends of the supporting surface, the supporting surface and each of the flat side surfaces are connected by a transitional surface, and the transitional surface is configured as a stepped surface;
   wherein a maximum distance between a circle center of the second cambered surface and the first cambered surface in a third direction is H2, a distance between an end of the curved section away from the flat section and the flat section in the third direction is H1, and H2 is less than or equal to H1, wherein the third direction is a direction parallel to a symmetry axis of a cross section of the elastic lamination seat;
   wherein the lamination device comprises stop blocks located at two sides of the elastic lamination seat in a second direction, each of the stop blocks is movable, each of the stop blocks can move along the second direction and can move along the third direction, before the driving mechanism drives the elastic lamination seat to move towards the cover plate, each of the stop blocks moves to a position corresponding to a position of the third cambered surface.

2. The lamination device according to claim 1, wherein a cross-sectional shape of the elastic lamination seat is a symmetrical shape, the second cambered surface is tangentially connected to the first cambered surface, and a length of the first cambered surface is equal to a length of the flat section of the flexible display panel.

3. The lamination device according to claim 2, wherein a radius of the second cambered surface is less than or equal to a minimum radius of the curved section of the flexible display panel.

4. The lamination device according to claim 2, wherein a width in a first direction between two ends on a side, facing the elastic lamination seat, of the flexible display panel after being laminated onto the cover plate is W, a width of the bearing surface in the first direction is W1, and W1 is less than W, wherein the first direction is a direction perpendicular to a symmetry axis of a cross section of the elastic lamination seat.

5. The lamination device according to claim 2, wherein an angle between a tangent at a junction of the second cambered surface and the third cambered surface and a first direction is $\alpha 2$, and an angle between a tangent at an endpoint of one end, away from the flat section, of the curved section of the flexible display panel and the first direction is $\alpha 1$, $\alpha 2 \geq \alpha 1$, and the first direction is a direction perpendicular to a symmetry axis of a cross section of the elastic lamination seat.

6. The lamination device according to claim 5, positions of the stop blocks corresponding to a position of the third cambered surface in a direction perpendicular to the flat section, each of the stop blocks having a barrier wall configured to be in contact with a side wall of the elastic lamination seat, the barrier wall preventing the deformation of the elastic lamination seat in an extending direction of the elastic lamination seat when the driving mechanism drives the elastic lamination seat to move toward the cover plate, wherein the second direction is a direction parallel to the extending direction of the elastic lamination seat.

7. The lamination device according to claim 6, wherein the barrier wall is configured as a cambered surface protruding toward the elastic lamination seat.

8. The lamination device according to claim 5, wherein in the second direction, a radius of the third cambered surface gradually increases from the middle of the elastic lamination seat toward two ends, and the second direction is a direction parallel to an extending direction of the elastic lamination seat.

9. The lamination device according to claim 1, wherein the flat side surfaces are in smoothly transitional connection with the deformation bearing portion.

10. The lamination device according to claim 9, wherein a height of the elastic lamination seat in a third direction ranges from 30 mm to 40 mm, and the third direction is a direction parallel to a normal line of the supporting surface.

11. The lamination device according to claim 9, further comprising a base, the base being arranged between the supporting surface and the driving mechanism, the driving mechanism driving the elastic lamination seat to move through the base, a side of the base facing the supporting surface being provided with a groove matching the deformation supporting portion, the supporting surface being embedded in the groove.

12. The lamination device according to claim 1, wherein a material of the elastic lamination seat comprises silicone, and a hardness of the elastic lamination seat ranges from 20A to 40A.

13. The lamination device according to claim 2, wherein an angle of the curved section of the flexible display panel after being laminated onto the cover plate ranges from 90° to 150°.

14. The lamination device according to claim 2, wherein the flat side surfaces are in smoothly transitional connection with the deformation bearing portion.

15. The lamination device according to claim 14, wherein a height of the elastic lamination seat in a third direction ranges from 30 mm to 40 mm, and the third direction is a direction parallel to a normal line of the supporting surface.

16. The lamination device according to claim 14, further comprising a base, the base being arranged between the supporting surface and the driving mechanism, the driving mechanism driving the elastic lamination seat to move through the base, a side of the base facing the supporting surface being provided with a groove matching the deformation supporting portion, the supporting surface being embedded in the groove.

17. The lamination device according to claim 3, wherein the elastic lamination seat further comprises a deformation supporting portion, the deformation supporting portion comprises a supporting surface opposite to the bearing surface and flat side surfaces located at two ends of the supporting surface, and the flat side surfaces are in smoothly transitional connection with the deformation bearing portion.

* * * * *